(12) United States Patent
Borchers et al.

(10) Patent No.: US 6,799,134 B2
(45) Date of Patent: Sep. 28, 2004

(54) CHARACTERIZATION OF SELF-TIMED SEQUENTIAL CIRCUITS

(75) Inventors: Brian D. Borchers, Wylie, TX (US); Stephen W. Spriggs, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/216,455

(22) Filed: Aug. 9, 2002

(65) Prior Publication Data

US 2004/0030512 A1 Feb. 12, 2004

(51) Int. Cl.⁷ .............................................. G06F 19/00
(52) U.S. Cl. ........................................ 702/125; 710/5
(58) Field of Search .................... 702/125, 46, 79, 702/75, 76, 78, 176, 177, 178; 375/224, 225; 710/5, 6, 20, 36

(56) References Cited

U.S. PATENT DOCUMENTS

| | | | | | |
|---|---|---|---|---|---|
| 5,553,276 | A | * | 9/1996 | Dean | 713/500 |
| 6,065,126 | A | * | 5/2000 | Tran et al. | 713/401 |
| 6,167,097 | A | * | 12/2000 | Marston et al. | 375/316 |
| 6,397,362 | B1 | * | 5/2002 | Ishiyama | 714/724 |

* cited by examiner

*Primary Examiner*—Marc S. Hoff
*Assistant Examiner*—Edward Raymond
(74) *Attorney, Agent, or Firm*—Rose Alyssa Keagy; W. James Brady, III; Frederick J. Telecky, Jr.

(57) ABSTRACT

A method and circuit for verifying the burst-mode operation and the frequency characterization of a self-timed sequential circuit 2 in burst mode by detecting and measuring an output 15 of the self-timed sequential circuit 2.

15 Claims, 2 Drawing Sheets

CHARACTERIZATION OF SELF-TIMED SEQUENTIAL CIRCUITS

BACKGROUND OF THE INVENTION

This invention relates to the verification of burst-mode operation and the frequency characterization of self-timed sequential elements in burst mode.

DETAILED DESCRIPTION OF THE INVENTION

Self-timed sequential elements are designed to operate in "burst" mode, i.e. generate a clock pulse when they are finished with their current operation and ready for the next operation. Additional circuitry can be used to verify that these self-timed sequential elements can operate in "burst" mode and to also determine the frequency of the self-timed sequential element in "burst" mode. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

Figure 1:
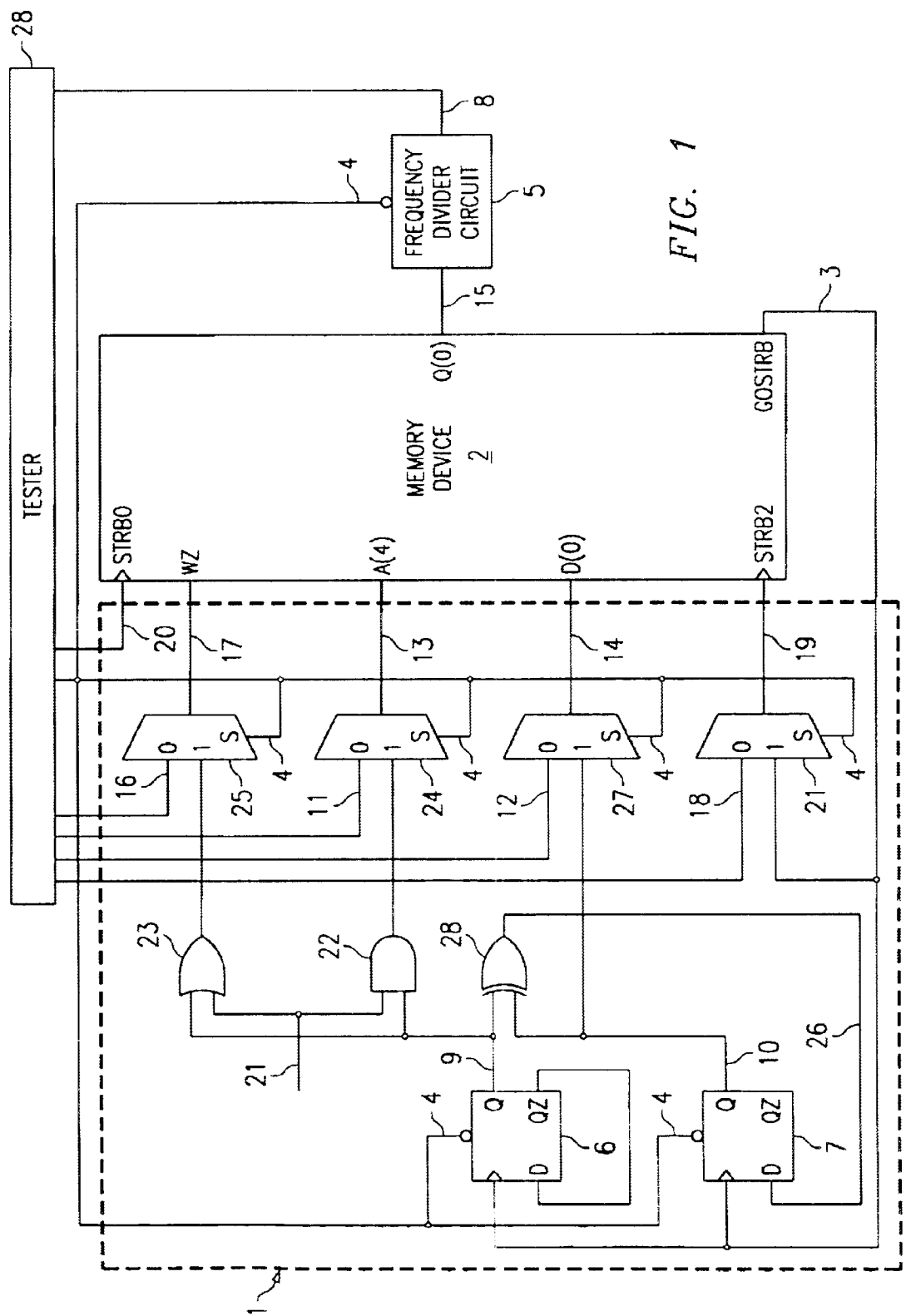
FIG. 1 shows the best mode OCM circuit.

Referring to the drawings, FIG. 1 depicts a best mode on-chip measurement ("OCM") oscillation circuit, 1, for testing the burst mode operation of a self-timed sequential device, 2, as well as the frequency of operation of that device. The self-timed sequential element used herein for describing the invention is a memory device. The output pulse signifying that the memory is ready for the next operation is produced on output pin 3 called "GOSTRB" (acronym for "ghost strobe").

In the best mode application, there is a set-up procedure that occurs before the measurements are performed. The measurement operation for the memory in read-read mode will be described first. In read-read mode, every cycle is a read operation that switches between two addresses.

During the set up operation, the oscillator enable pin 4 is set by tester 28 to a logic level "0". Now the frequency divider circuit 5 and the two D flip-flops 6 and 7 are initialized to a logic level "0" output (on pins 8, 9, and 10 respectively). To preset the memory in read-read mode, two addresses will be written to address input 13 with opposite data. Tester 28 uses input lines 11 and 12, of multiplexers 24 and 25 respectively, to write to the memory addresses on memory input line 13 and data on memory input line 14 (oscillator enable 4 is still logic "0"). Tester 28 can be any well-known semiconductor circuit tester.

In the best mode application, address 0 and address 16 are used for this example. It is not critical which address gets which data. It only matters that they are opposite so that switching the address between reads causes the data output pin ("Q") on line 15 to change every cycle, thus creating an oscillation. During set-up, the address pins are set to read from address 0. This initializes the oscillation circuit 1 to be the same as it will be when the oscillator starts and therefore help avoid any glitching.

Also during set up, the tester 28 places the memory in read-read mode by using line 16 to set write enable input pin 17 to a logic "1" level. Lastly, the tester 28 uses line 18 to initialize the STRB2 (i.e. clock input strobe 2) input 19 to a logic level "0".

Once the set-up procedure is complete, the tester sets oscillator enable 4 to a logic level "1". Tester 28 also sends a pulse on STRB0 (i.e. clock input strobe 0) input 20 and causes the memory 2 to execute its first operation. Once that operation is complete, memory 2 will send a pulse out on GOSTRB line 3 because it is a self-timed device. As an example, memory 2 may be a 1.3 GHz memory with an expected output pulse frequency on data output 15 of 750 ps and an output pulse frequency on GOSTRB 3 of 800 ps.

Once a pulse is sent by memory 2 on GOSTRB 3, it goes through a multiplexer 21 to the memory input clock STRB2 on line 19. The same pulse is sent on line 3 to clock the D flip-flops 6 and 7. Flip-flop 6, known as a "toggle" flop, now sends a pulse on output 9 that is opposite its previous value (in this first cycle it changes from a logic level "0" to a logic level "1"). This new value is sent to AND gate 22, putting a new value (a logic level "1" in this first cycle) through multiplexer 24 to address input 13. This changed input value on line 13 changes the address and therefore the data output 15 changes to the opposite logic level. During this process, the tester 28 holds the write enable pin 17 to a logic level "1" by holding input 21 to a logic level "1". This logic level "1" passes through OR gate 23 and multiplexer 25 to write enable 17. Therefore the memory stays in read-read mode and data input line 14 is in a "Don't Care" state.

Figure 2:
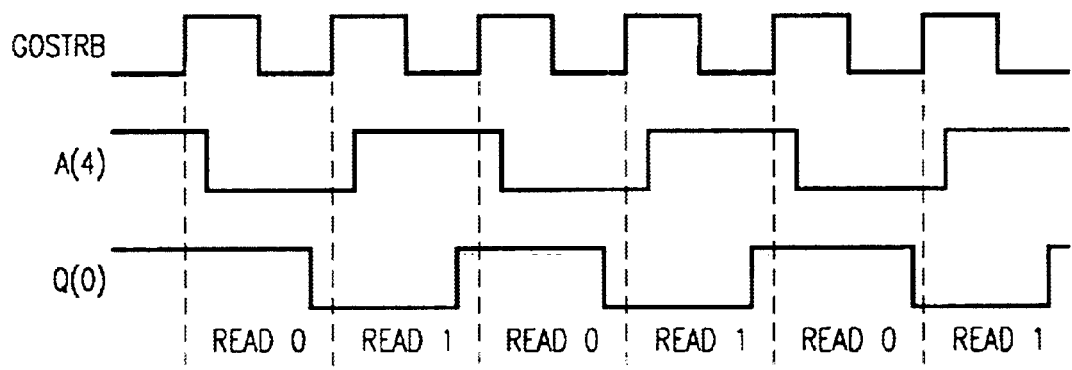
FIG. 2 shows OCM waveforms for read-read mode.

As this cycle continues, the output signal on line 15 will toggle between logic level "0" and logic level "1". FIG. 2 shows OCM waveforms for selected pins during the read-read operation. Note that the address 13 toggles every cycle. Furthermore, both the address and the output 15 toggle at one half the GOSTRB 3 output rate (line 3).

The signal on line 15 is sent to the tester 28 to be evaluated. However, in the best mode application, the signal on line 15 is processed through a frequency divider 5 before being evaluated by the tester 28. The frequency divider will take the signal received on line 15 and divide it down (i.e. divided by 32) so that the signal sent to the tester 28 on line 8 is at a slower, more comfortable speed for the average tester 28 to process without expensive high-speed circuitry. Without this divide down circuitry either A) expensive test circuitry will be needed to process the high-speed signals created by the high speed memory operating at the rated speeds, or B) the memory will have to be operated at a speed far below its rated operating speed during device test (possibly resulting in an inaccurate calculation of the true access time).

The detection of the toggle signal by the tester 28 on line 8 means that the memory 2 created a pulse output on GOSTRB 3 and that pulse output is strong enough to drive external circuitry. (Here memory 2 drives itself through input 19). Thus the memory's burst mode function is shown as operational because output 15 is toggling.

Because the memory 2 is a self-timed sequential element, the maximum operating frequency of memory 2 in "burst" mode can also be determined by the tester 28 through the analysis of the signal on line 8. There is virtually no delay in the signal path from the GOSTRB output 3 to the STRB2 input 19. Therefore, the frequency of the signal on line 8 is the maximum frequency that the memory 2 can operate in "burst" mode (e.g. when memory 2 is clocked with GOSTRB). In this best mode application the frequency of the signal on line 8 must be multiplied by two since the memory output switches at only half the clock rate.

It is understood that the end user of the self-timed sequential element 2 may be able to operate the element at a higher frequency than the frequency that is calculated during "burst" mode operation as described above. Specifically, the difference between "burst" mode frequency and maximum frequency is a margin built into the GOSTRB circuit that allows it to track with voltage, process, and temperature. However, the "burst" mode frequency is typically the fastest that an end user will be able to reliably use the self-timed sequential element 2.

Figure 3:
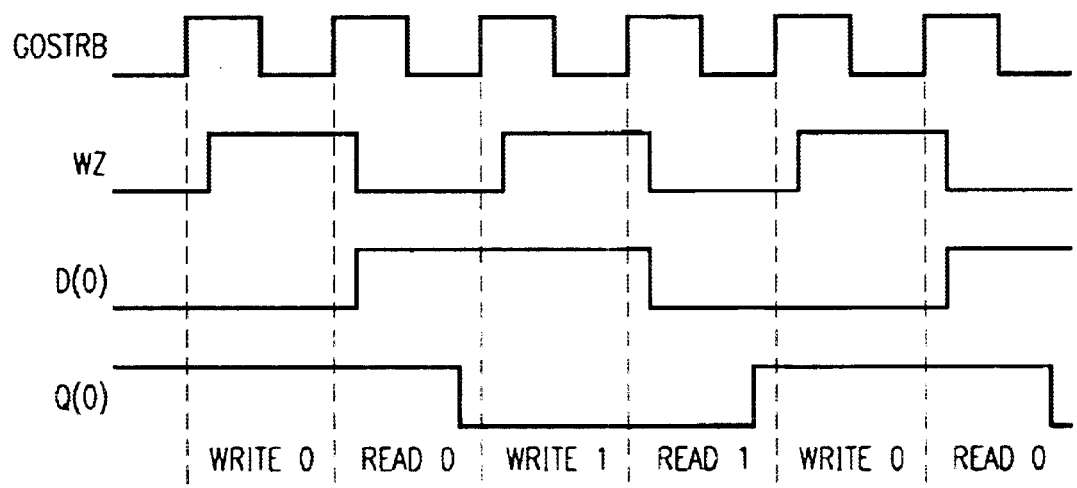
FIG. 3 shows OCM waveforms for write-read mode.

FIG. 3 shows selected OCM waveforms for the access time measurement operation performed in write-read mode. As an example, this test would be used in situations where the self-timed sequential element is a memory with write-through capability. In write-read mode, the cycles alternate between writing and reading and the final frequency is a combination of the two. This operation will also be very similar to the read-read operation previously described.

Once the set-up procedure is complete, the tester sets oscillator enable 4 to a logic level "1". Next, the tester 28 sends a pulse on STRB0 input 20 and the memory 2 executes its first operation. Once that operation is complete, memory 2 will send a pulse out on GOSTRB line 3 because it is a self-timed device. As an example, memory 2 may be a 1.3 GHz memory with an expected output pulse frequency on data output 15 of 750 ps and an output pulse frequency on GOSTRB 3 of 800 ps.

Once a pulse is sent by memory 2 on GOSTRB 3, it goes through a multiplexer 21 to the memory input clock STRB2 on line 19. The same pulse is sent on line 3 to clock the D flip-flops 6 and 7. Flip-flop 6, a "toggle" flop, now sends a pulse on output 9 thatis opposite its previous value (in this first cycle it changes from a logic level "0" to a logic level "1"). This new value is sent to AND gate 22, putting a new value (a logic level "1" in this first cycle) through multiplexer 24 to address input 13. This changed input value on line 13 changes the address and therefore the data output 15 changes to the opposite logic level. Flip-flop 7 sends the input signal on line 26 to output 10. This signal is passed through multiplexer 27 on line 14 to the data input of memory 2. The output signal on 10 is also input into NOR gate 28, along with the output signal of flip-flop 6 on 9. The output 26 of NOR gate 28 is sent to the data input of flip-flop 7 to wait for the next clock pulse to propagate through flip-flop 7.

A synchronous two-bit counter is created by flip-flops 6 and 7, NOR gate 28, AND gate 22, and OR gate 23. In the write-read operation of the best mode application, only address zero ("A0") is used. A full cycle will take four GOSTRB pulses on line 3. Namely, the first two pulses will write then read a logic level "0" and then the second two will write then read a logic level "1". The data switches when the memory is being switched from a read state to a write state so there should be no issues with the set-up or hold of the write data.

As shown in FIG. 3 the write enable ("WZ") input on line 17 toggles with every GOSTRB cycle. Both the input pin 14 and the output pin 15 toggles at one half the GOSTRB cycle (i.e. write 0, read 0, write 1, read 1). In write-read mode, the frequency of the signal on line 8 must be multiplied by 4: multiplied by 2 because the memory only switches at half the clock speed and then multiplied by 2 again because it is only switching every other cycle.

Various modifications to the invention as described above are within the scope of the claimed invention. As an example, instead of the GOSTRB pulse being used to clock the memory device on input STRB2 as described above, the tester 28 could directly feed the desired clock pulses into the memory input STRB2. Furthermore, the strobe input pins could be changed; for example, the GOSTRB signal could be sent to a different clock input such as the STRB1 input (not shown). Similarly, different address and data inputs couldbe used then those described above. In fact, the test could be set up to write to and read from every address and data input; thus exercising every address and data input on the memory.

The above-described tests could be incorporated into the BIST (Built-In Self Test) routine and incorporated within the self-timed (i.e. memory) device. Also, the frequency measurements could be analyzed through the use of an oscilloscope instead of a tester 28.

The logic functions described above with gate logic could be accomplished with other logic arrangements or by an ASIC. Moreover, the functions comprehended by the invention could be accomplished in various technologies such as CMOS or TTL.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for detecting an output of a self-timed sequential circuit comprising:
    determining whether a clock pulse is generated when said circuit completes its current operation and is ready to perform the next operation.

2. A method for measuring an output of a self-timed sequential circuit comprising:
    determining whether a clock pulse, generated when said circuit completes its current operation and is ready to perform the next operation, is useable by said circuit or other circuits.

3. A method for measuring an output of a self-timed sequential circuit comprising:
    determining the frequency of a clock pulse, generated when said circuit completes its current operation and is ready to perform the next operation.

4. The method of claim 3 wherein a data output signal of said circuit is divided down before said determination of said frequency.

5. A method for detecting and measuring an output of a self-timed sequential circuit comprising:
    determining whether a clock pulse is generated when said circuit completes its current operation and is ready to perform the next operation; and
    determining whether said clock pulse is useable by said circuit or other circuits.

6. A method for detecting and measuring an output of a self-timed sequential circuit comprising:
    determining whether a clock pulse is generated when said circuit completes its current operation and is ready to perform the next operation; and
    determining the frequency of said clock pulse.

7. The method of claim 6 wherein a data output signal of said circuit is divided down before said determination of said frequency.

8. A method for detecting and measuring an output of a self-timed sequential circuit comprising:
   determining whether a clock pulse, generated when said circuit completes its current operation and is ready to perform the next operation, is useable by said circuit or other circuits; and
   determining the frequency of said clock pulse.

9. The method of claim 8 wherein a data output signal of said circuit is divided clown before said determination of said frequency.

10. A method for detecting and measuring an output of a self-timed sequential circuit comprising:
    determining whether a clock pulse is generated when said circuit completes its current operation and is ready to perform the next operation; and
    determining whether said clock pulse is useable by said circuit or other circuits; and
    determining the frequency of said clock.

11. The method of claim 10 wherein a data output signal of said circuit is divided down before said determination of said frequency.

12. A test circuit for detecting and measuring an output of a self-timed sequential circuit comprising:
    set-up circuitry coupled to said self-timed sequential circuit; and
    oscillator circuitry coupled to said self-timed sequential circuit.

13. The test circuit of claim 12 wherein said test circuit also comprises frequency divider circuitry coupled to a data output of said self-timed sequential circuit.

14. A test circuit for detecting and measuring an output of a self-timed sequential circuit comprising:
    means for setting-up said self-timed sequential circuit for desired operation during test, said set-up means coupled to said self-timed sequential circuit;
    means for returning an output pulse of said self-timed sequential circuit to a clock input of said self-timed sequential circuit, said returning means coupled to said self-timed sequential circuit;
    means for oscillating a data output of said self-timed sequential circuit; said oscillating means coupled to said self-timed sequential circuit; and
    means for measuring the frequency of said data output of said self-timed sequential circuit, said measuring means coupled to said self-timed sequential circuit.

15. The test circuit of claim 14 wherein said measuring means further comprises means for dividing down said frequency of said data output to determine said frequency of said data output, said dividing down means coupled to said self-timed sequential circuit.

* * * * *